United States Patent [19]  
Nozawa et al.

[11] Patent Number: 4,459,325  
[45] Date of Patent: Jul. 10, 1984

[54] SEMICONDUCTOR DEVICE AND METHOD FOR MANUFACTURING THE SAME

[75] Inventors: Hiroshi Nozawa; Junichi Matsunaga; Naohiro Matsukawa, all of Yokohama, Japan

[73] Assignee: Tokyo Shibaura Denki Kabushiki Kaisha, Japan

[21] Appl. No.: 317,616

[22] Filed: Nov. 3, 1981

[30] Foreign Application Priority Data

| Nov. 6, 1980 [JP] | Japan | 55-156139 |
| Nov. 6, 1980 [JP] | Japan | 55-156140 |
| Nov. 6, 1980 [JP] | Japan | 55-156141 |
| Nov. 6, 1980 [JP] | Japan | 55-156146 |
| Nov. 6, 1980 [JP] | Japan | 55-156147 |
| Nov. 27, 1980 [JP] | Japan | 55-165843 |

[51] Int. Cl.³ .............. B05D 5/12; H01L 21/306; B44C 1/22; C03C 15/00
[52] U.S. Cl. .................. 427/93; 29/576 W; 29/580; 156/643; 156/648; 156/657; 156/662; 148/187; 357/50; 427/85; 430/313
[58] Field of Search .................. 148/1.5, 187; 204/192 EC, 192 E; 156/643, 646, 648, 653, 657, 659.1, 662, 628; 357/50; 427/38, 39, 85, 86, 93-95, 88; 430/313, 315; 29/580, 576 R, 576 B, 576 W, 571

[56] References Cited

U.S. PATENT DOCUMENTS

| 3,753,803 | 8/1973 | Nomura et al. | 29/578 X |
| 4,137,109 | 1/1979 | Aiken et al. | 156/648 X |
| 4,332,837 | 6/1982 | Peyre-Lavigne | 427/93 X |

Primary Examiner—William A. Powell  
Attorney, Agent, or Firm—Finnegan, Henderson, Farabow, Garrett & Dunner

[57] ABSTRACT

A method for element isolation utilizing insulating materials in a semiconductor substrate is proposed. In this method an oxidizable material layer of polycrystalline silicon or the like is formed and then the oxidizable material layer is selectively oxidized, using an oxidation-proof mask thereby forming a thick oxide layer. Thereafter, the oxidation-proof mask is removed and unoxidized oxidizable material below the mask is perpendicularly etched off, leaving part of the oxidizable material which is then oxidized to form together with the thick oxide layer an element isolation. This invention further proposes a semi-conductor device having element isolation layer whose bird's beak is very small in length.

18 Claims, 18 Drawing Figures

F I G. 17
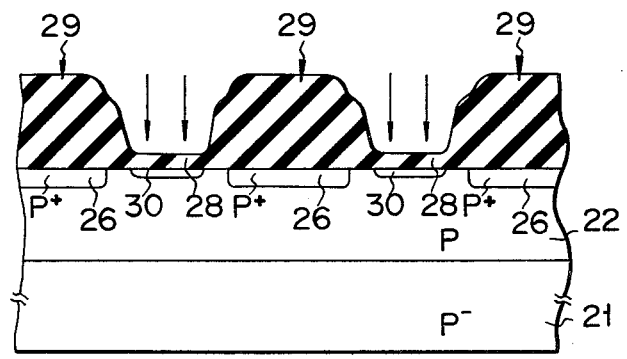
F I G. 18
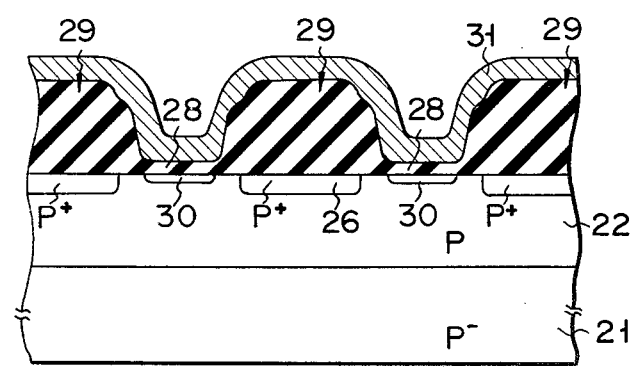

SEMICONDUCTOR DEVICE AND METHOD FOR MANUFACTURING THE SAME

BACKGROUND OF THE INVENTION

This invention relates to the production method for a semiconductor device, particularly to the element isolation technique utilizing an insulating material and a semiconductor device which is manufactured by means of this technique. As isolation technique in semiconductor integrated circuits, there are generally known methods in which the isolation regions are formed by selective oxidation for facilitating higher packaging density and a more effective manufacturing process. According to such methods, since the periphery of the active region is surrounded by the oxide layer, self-alignment is possible by methods such as base diffusion so that unnecessary parts which have been conventionally required for masking may be eliminated. This allows a higher packaging density. Furthermore, since on the sides of element region are disposed deep oxide layers, the coupling capacitance is significantly reduced. This method, however, adopts a structure in which the thermally oxidized layer is selectively embedded in the silicon substrate. This causes a great strain in the silicon substrate, degrades the electrical characteristics of the element, and thus imposes strict limits as to the selection of the structure, configuration, film thickness, the conditions for selective oxidation of the oxidation mask, and occasionally on the selection of the material itself for the silicon substrate. This is disclosed, for example, in IEDM, "High Pressure Oxidation for Isolation of High Speed Bipolar Devices", pp. 340-343, 1979.

In the conventional element isolation technique utilizing an insulating material, the field oxidizing time is long. This gives a significant rise to the diffusion and redistribution of the impurity layer in the channel stopper. For example, when the diffusion in the transverse direction is great, the effective channel width of the MOS transistor is reduced and the drain coupling capacitance increases, thus obstructing realization of a high speed device.

Also, if thermal oxidation is effected using a silicon nitride layer as mask, a silicon nitride layer called "white ribbon" is formed in the silicon substrate below the silicon nitride layer, causing a poor voltage resistivity in the element. Moreover, as a double-layer mask composed of a silicon nitride layer and an oxide layer is used as an oxidation-proof mask, a bird's beak of almost 1 μm is thrusted into below the silicon nitride layer. As a result, it was difficult to form an isolation layer with the distance between elements been less than 2 μm. This is reported, for instance, in "Bird's Beak Configuration and Elimination of Gate Oxide Thinning Produced during Selection Oxidation", pp. 216-222, J.E.C.S., 1980.

SUMMARY OF THE INVENTION

This invention has been made in view of the aforementioned background and offers a method to produce a semiconductor device which is suitable for the formation of fine semiconductor elements, has excellent electrical characteristics and is capable of preventing, at the time of selective oxidation for the formation of element isolation layers, the thermal effects upon semiconductor substrates resulting in defects, of suppressing the growth of the bird's beak at the time of the selective oxidation and also of preventing any formation of an oxynitride layer below a silicon nitride layer, and also offers semiconductor devices to be produced with this method.

In other words, this invention offers a method of producing a semiconductor device, which comprises steps of creating an oxidizable material layer on a semiconductor substrate, selectively forming an oxidation proof mask directly on this oxidizable material layer and then selectively oxidizing the said oxidizable material layer using said mask thereby creating a thick oxide layer, performing a virtually perpendicular etching of an exposed oxidizable material layer on the substrate after removing the aforementioned oxidation-proof mask and to leave part of the said oxidizable material layer on the perpendicularly etched surface and oxidizing the oxidizable material layer remaining along the perpendicularly etched surface.

Furthermore, this invention offers a semiconductor device which features in that the length of the bird's beak of an element isolation layer which is thrusted out over the upper side of a semiconductor substrate into the element region of the said substrate is less than one fourth of the thickness of the element isolation layer.

BRIEF DESCRIPTION OF THE DRAWINGS

FIGS. 7 through 12 and 13 through 18, respectively, present sectional views illustrating in sequential order other embodiments of this invention.

DETAILED DESCRIPTION OF THE PREFERRED EMBODIMENTS

Figure 1:
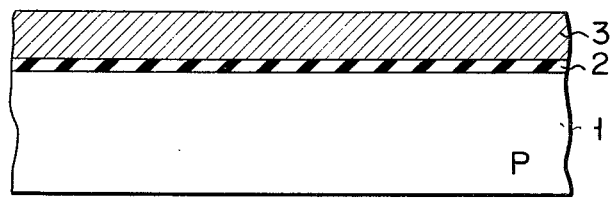
FIGS. 1 through 6 present sectional views illustrating in sequential order a method of producing a MOS IC according to this invention.

The oxidizable material layer in this invention is utilized for forming an oxide layer as an element isolation layer by means of selective oxidation. As materials for such oxidizable material layer, polycrystalline silicon doped with high concentration of impurities such as phosphorus, arsenic and boron, non-monocrystalline silicon, such as polycrystalline silicon, containing substantially no impurities and metal silicides such as molybdenum silicide, tungsten silicide and tantalum silicide may be useful. Such an oxidizable material layer may be formed on a semiconductor substrate with or without an oxide layer interposed therebetween. By disposing an oxide layer between the semiconductor substrate and the oxidizable material layer, it is possible to prevent the impurities in the oxidizable material layer from diffusing into the substrate at the time of selective oxidation. Such a construction is effective, particularly when polycrystalline silicon layer of high impurity concentration is employed.

As the diffusion of impurities in an oxidizable material layer is mainly dependent upon the time period of and temperature of the selective oxidation step, a deposition of an oxide layer between the substrate and the oxidizable material layer sometimes may not be sufficient to prevent the impurities in the oxidizable material layer from diffusing. Therefore, if the temperature at the time of the selective oxidation is rather high or the duration of selective oxidation is long, it is advisable to make thicker the oxide layer, thereby securely preventing the diffusion of the impurities. To be more specific, when performing a selective oxidation for 200 minutes at 1,000° C. on a polycrystalline silicon layer with the phosphorous concentration of $1 \times 10^{16}/cm^3$, it is desirable to make the oxide layer more than 1,500 Å thick. As such an oxide layer, a thermally oxidized layer or a CVD-SiO$_2$ may be used.

Also, when an impurity-doped polycrystalline silicon layer is employed as an oxidizable material layer and etching of the polycrystalline silicon remaining on the substrate after selective oxidation is to be carried out the aforementioned oxide layer works as an etching stopper for protecting the substrate.

With this invention, it is possible to considerably suppress a growth of so-called bird's beak which is a phenomenon in which an oxide layer thrusts into below an oxidation-proof mask and at the same time to prevent a formation of an oxynitride layer on the surface of oxidizable material layer covered by the mask during the selective oxidation step by disposing the oxidation-proof mask consisting of for example silicon nitride directly upon the oxidizable material layer. As a result of a considerable suppression of the growth of the bird's beak, the oxidizable material layer remaining along the perpendicularly etched surface after an anisotropic etching is rather small in size and it becomes possible to easily and completely oxidize it. The fact that any oxynitride layer is not produced has the following effects. Generally, a thick oxide layer is formed through selective oxidation in the region of the exposed portion of the oxidizable material layer and then the mask is removed. Subsequently, the remaining oxidizable material layer is also eliminated. In eliminating the remaining oxidizable material layer, the spatter ion etching technique is employed in order to prevent that the element isolation layer to be formed takes an overhung structure. However, if a ribbon-like oxynitride layer is produced and left as it is at the time of etching, the oxynitride layer acts as an etching mask to leave a portion of the oxidizable material layer to remain along the edges of the thick oxide layer. If the oxidizable material layer thus left is thermally oxidized to convert into an oxide layer, the element isolation layer will get larger, i.e., the size conversion difference will get larger to obstruct the production of finer semiconductor elements. It is therefore highly beneficial from the standpoint of making semiconductor elements finer that no oxynitride layer is formed on the surface of oxidizable material layer convered by the oxidation-proof mask at the time of selective oxidation.

It is desirable to limit the thickness of this oxidation-proof mask to more than three times of the thickness of the oxide layer formed between the oxidizable material layer and the semiconductor substrate and less than 4,000 Å.

A mask to prevent a diffusion of impurities may be placed upon this oxidation-proof mask. By disposing such a mask, consisting of for example CVD SiO$_2$, to prevent a diffusion of impurities in the oxidation-proof mask, it is possible to prevent an erroneous formation of a channel stopper on the semiconductor surface below the oxidation-proof mask at the time of ion implantation for forming a channel stopper. Especially if it is necessary to create channel stoppers separately on P well and on the N-type substrate as in the case of complementary MOS IC, a resist mask made of for example rubber which is previously used to create lamination layers cannot be used again as it is, so that another resist mask pattern has to be formed for providing a channel stopper after removing the resist mask previously formed, and also when in this case it is desired to form a channel stopper in self-alignment by making use of the resist mask used for making the lamination layers, it is inevitable that the prevention of an erroneous implantation of impurities in an element region is effected only with the resist mask which has been used to create the lamination layers. Thus a formation of an impurities diffusion preventing layer on the oxidation-proof layer as an ion implantation mask is very important in the sense that the application of this invention can be extended to the production of complementary MOS IC.

After an ion implantation to form a channel stopper, it is necessary to eliminate the ion implantation preventing mask consisting of CVD SiO$_2$ prior to selective oxidation, because it is not possible to selectively remove only CVD SiO$_2$ after selective oxidation as oxidizable materials such as polysilicon in the region not covered by the oxidation-proof mask also change to silicon dioxides.

As means to eliminate oxidizable material layers remaining after the selective oxidation in this invention, it is desirable to adopt one of anisotropic etching techniques like the reactive spatter ion etching and the ion beam etching with which it is possible to perform a perpendicular etching on the remaining oxidizable material layers on the substrate and to prevent a formation of an overhung structure of the thick oxide layer edges.

In this invention, it is also possible to employ, as a semiconductor substrate, a laminated structure comprising a P-type silicon substrate, a N-type silicon substrate or a compound substrate such as GaAs, and a monocrystalline semiconductor layer epitaxially grown on any one of aforementioned substrates such as P-type silicon substrate and etc. Also, a monocrystalline insulation substrate such as sapphire substrate or spinel substrate, each superposed with a monocrystalline semiconductor may be used as a semiconductor substrate. As means to deposit a monocrystalline semiconductor layer on a monocrystalline insulation substrate, (1) a vapor epitaxial growth process; or (2) a process in which polycrystal or amorphous semiconductor layer is first deposited on the insulation substrate by means of a vapor growth method such as CVD method or PVD (Physical Vapor Deposition) method, and then the irradiation of an energy beam such as laser beam is effected to monocrystalize the polycrystal or amorphous semiconductor layer with the insulation substrate been utilized as a seed nucleus; may be adapted.

An application of this invention to produce n channel MOS IC will be explained below using FIGS. 1 through 6.

EXAMPLE 1

(I) First, a p-type monocrystalline silicon substrate 1 is thermally oxidized to grow on its main surface a thermally oxidized layer 2 of 1,000 Å thick. Then, a polycrystalline silicon is vapor-grown on the thermally oxidized layer 2 within POCl$_3$ atmosphere to deposit a 4,000 Å of phosphorus-doped or impurity-nondoped polycrystalline silicon layer 3 which oxidizes faster than the substrate 1 (FIG. 1). Then, a 2,000 Å silicon nitride layer is deposited through vapor-growth process directly on the polycrystalline silicon layer to form a number of silicon nitride patterns 4 of 2 μm wide (W) and 2 μm pattern pitch (P) through patterning by photo-etching process using reactive spatter ion etching. Then, using the silicon nitride pattern 4 as a mask, boron ions are implanted under the conditions of 180 KeV output and $4 \times 10^{13}$/cm$^2$ dose and then activated to form a p$^+$-type channel stopper 5 on the substrate 1

Figure 2:
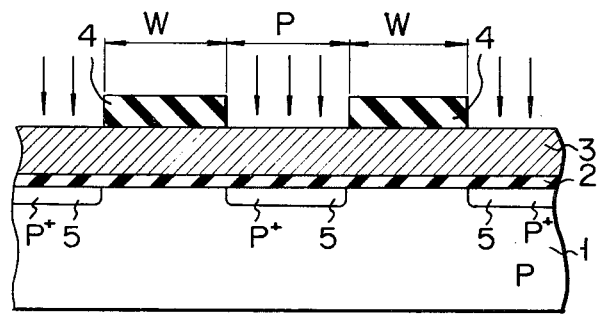

(FIG. 2). In this case, the photo-resist pattern used in the formation of the silicon nitride pattern may also be used as a mask in the boron ion implantation step.

Figure 3:
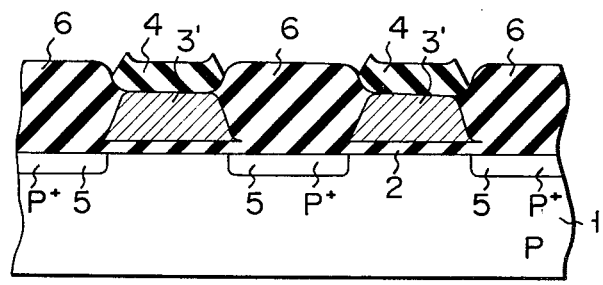

(II) Then, the selective oxidation of the polycrystalline silicon layer 3 is carried out for 200 minutes at 1,000° C. with the silicon nitride pattern 4 been used as an oxidation-proof mask. In so doing, the exposed portions of the polycrystalline silicon layer 3 are oxidized to form a 8,000 Å oxide layer for element isolation with 0.15 μm dimention-conversion difference (FIG. 3). Any oxynitride layer is not recognized to be formed on the surface of the remaining polycrystalline silicon layer 3' along the thick oxide layer 6 below the silicon nitride pattern 4. Also, in the selective oxidation, the thermally oxidized layer 2 is found to be effective in preventing the phosphorus in the polycrystalline silicon layer 3' from diffusing into the silicon substrate 1.

Figure 4:
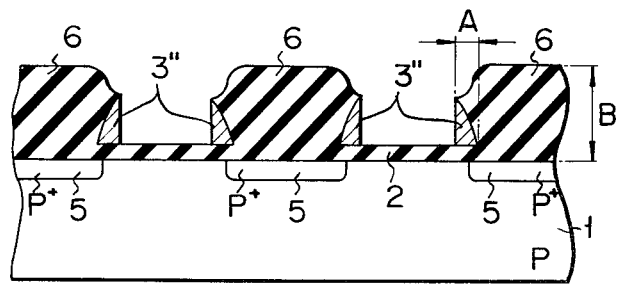
Figure 5:
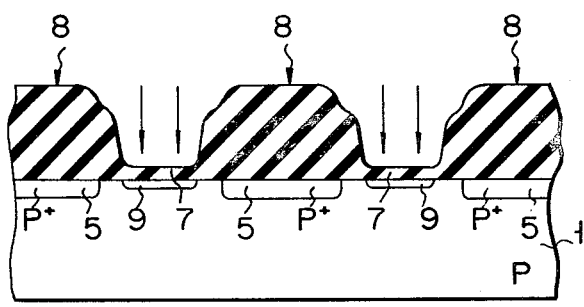

(III) Then, after removing the silicon nitride pattern 4 by means of $CF_4$ dry etching, the remaining polycrystalline silicon layer 3' is eliminated by means of $CCl_4$ reactive spatter etching. In so doing, as no oxynitride layer exists upon the remaining polycrystalline silicon layer 3', the polycrystalline silicon 3' is etched with self-alignment substantially in perpendicular to the thick oxide layer 6, and a minute polycrystalline silicon layer 3'' is left, as shown in FIG. 4, on the overhung section of the thick oxide layer 6. Then, the exposed thermal oxide layer 2 is eliminated with ammonium fluoride to expose part of the substrate 1 surface and then to perform thermal oxidation. In this process, a 400 Å gate oxide layer 7 is formed on the exposed part of the monocrystalline silicon substrate 1 and at the same time the polycrystalline silicon layer 3'' remaining on the overhung portion is oxidized to become an oxide layer thereby creating together with the oxidized silicon layer 3'' an element isolation layer 8 without a overhung like the aforementioned thick oxide layer 6 (FIG. 5). Using the element isolation layer 8 as a mask, boron is ion-implanted into the channel part of the substrate 1 below the gate oxide layer 7 under the conditions of 40 KeV output, $3 \times 10^{11}/cm^2$ dose to form a $p^+$-type impurities region 9 for the control of threshold value (FIG. 5).

Figure 6:
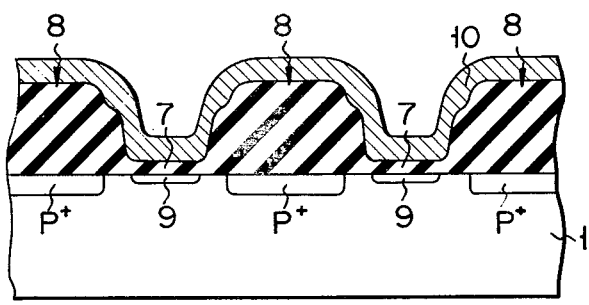

(IV) Then, following the conventional process, a gate electrode 10 consisting of polycrystalline silicon is formed on the gate oxide layer 7, and using the gate electrode 10 as a mask, arsenic is ion-implanted and activated to produce a $n^+$-type source and drain (not shown). After the formation of a $CVD-SiO_2$ layer and Al wiring, thermal treatment is effected for 60 minutes at 1,000° C. to produce a n channel MOS IC with about 0.8 V of threshold value (FIG. 6).

According to this method, therefore, as an element isolation layer is formed by means of selective oxidation of the polycrystalline silicon layer 3 which is oxidized faster than the monocrystalline silicon substrate 1 on which it is disposed, thermal effects upon the substrate 1 could be suppressed and thermally caused defects and rediffusion of impurities can be reduced. Also as an element isolation layer 8 is formed by means of selective oxidization of the polycrystalline silicon 3 on the substrate 1 instead of producing an element isolation layer by directly oxidizing the substrate 1 as seen in the conventional method, a considerable stress upon the substrate 1 could be avoided. Moreover, in the case of selective oxidation using as a mask a silicon nitride pattern 4 which is deposited directly upon the polycrystalline silicon layer 3, no oxynitride layer is created not only on part of the polycrystalline silicon layer 3 but also on the substrate 1. Thus, the monocrystalline silicon substrate 1 thus produced has very few defects and has excellent electrical characteristics to make it possible to produce highly reliable n channel MOS IC.

Also, when selectively oxidizing the polycrystalline silicon layer 3, the thrusting of the oxide layer into the polycrystalline silicon layer 3 below the silicon nitride pattern 4, i.e., bird's beak (A) (FIG. 4) could be controlled to less than 0.15 μm in length (less than one fourth of the thickness of the oxide layer (B) 0.8 μm) and no oxynitride layer is formed on the remaining polycrystalline silicon layer 3' and it is thus possible to etch in perpendicular to the thick oxide layer 6 the said polycrystalline silicon layer 3' with self-alignment. It is therefore possible to produce a fine element isolation layer 8 of small dimension-conversion difference and to obtain MOS IC comprising fine elements.

EXAMPLE 2

Figure 7:
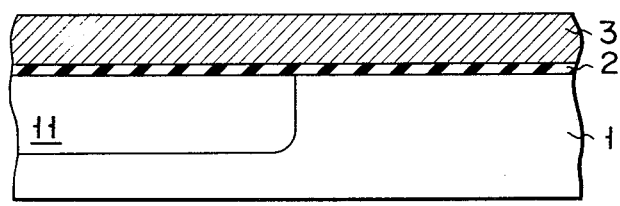
Figure 8:
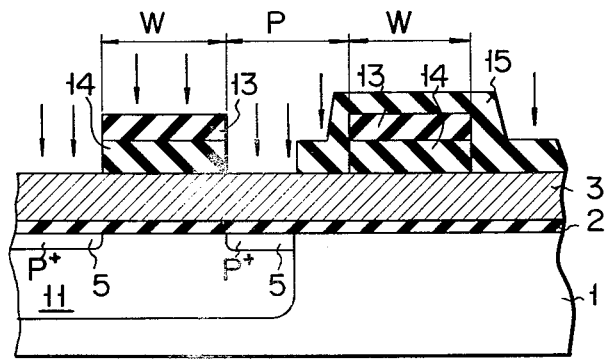

(I) After forming a P-well 11 on the N-type monocrystalline silicon substrate 1, the substrate 1 is thermally oxidized to produce a 1,000 Å thermally oxidized layer 2 on its main surface. Then, a polycrystalline silicon is vapor-grown upon the thermally oxidized layer 2 to deposit a 4,000 Å polycrystalline silicon layer 3 (FIG. 7). Next, a 2,000 Å silicon nitride layer 14 and then a 5,000 Å silicon dioxide layer 13 are deposited directly upon the polycrystalline silicon layer 3 to create a pattern consisting of a plurality of silicon nitride 14, $SiO_2$ 13, of 2 μm wide (W) and 2 μm pattern pitch (P) by means of patterning through photo etching process using reactive spatter ion etching. After disposing a resist mask 15 to block the new P-MOS side, an ion-implantation of boron is effected under the conditions of 180 KeV output and $4 \times 10^{13}/cm^2$ dose, using the laminated patterns comprising silicon nitride 14 and $SiO_2$ 13, and activated in order to create a $p^+$-type channel stopper 5 in P-well 11 (FIG. 8).

Figure 9:
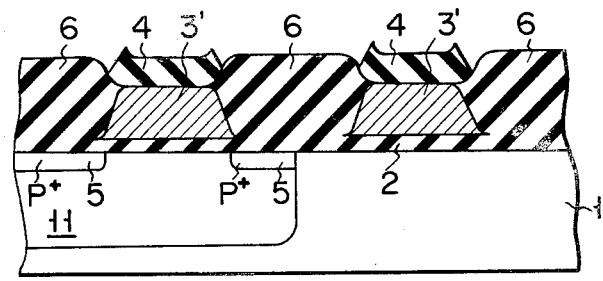

(II) Next, CVD $SiO_2$ 13 is removed by ammonium fluoride solution to selectively oxidize the polycrystalline silicon layer 3 using the silicon nitride pattern 14 as an oxidation-proof mask. In this process, the exposed parts of the polycrystalline silicon layer 3 are oxidized to form a thick oxide layer 6 of 8,000 Å thick for element isolation with the dimension-conversion difference being 0.15 μm (FIG. 9). No oxynitride layer is recognized to be created on the surface of the remaining polycrystalline silicon layer 3' along the silicon nitride pattern 14.

Figure 10:
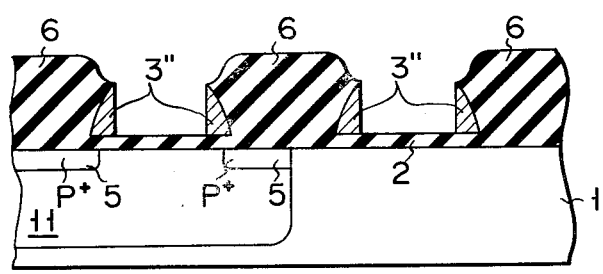
Figure 11:
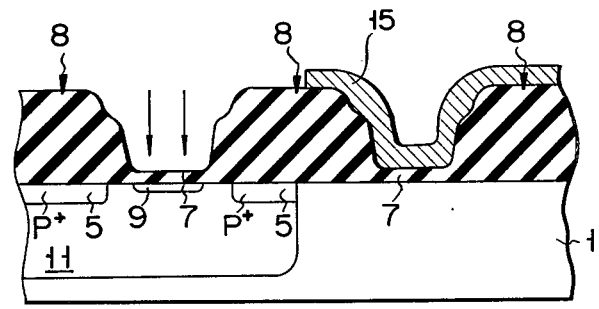

(III) Then, after removing the silicon nitride pattern 14 by means of $CF_4$ dry etching, the remaining polycrystalline silicon layer 3' is eliminated by means of $CCl_4$ reactive spatter etching. In so doing, as no oxynitride layer exists upon the remaining polycrystalline silicon layer 3', the said polycrystalline silicon layer 3' is etched with self-alignment in perpendicular to the thick oxide layer 6. As a result, a polycrystalline silicon layer 3'' is, as shown in FIG. 10, remained beneath the each overhung portion of the thick oxide layer 6. Then, the thermally oxidized exposed layer 2 is eliminated with ammonium fluoride to expose part of the substrate 1 surface and then thermal oxidation is performed. In this process, a 400 Å gate oxide layer 7 is formed on the exposed part of the monocrystalline silicon substrate 1 and at the same time the polycrystalline silicon layer 3'' remaining on the overhung is oxidized to become an oxide layer to create together with the thick oxide layer 6 an element isolation 8 without an overhung like the aforementioned thick oxide layer (FIG. 11). Using an ion implantation mask 15 such as CVD-SiO$_2$ and the element isolation layer 8 as a mask, boron is ion-implanted into the channel part of the P-well 11 below the gate oxide layer 7 under the conditions of 40 KeV output and $3\times10^{11}$/cm$^2$ dose to form a p$^+$-type impurities region 9 for the control of threshold value (FIG. 11).

Figure 12:
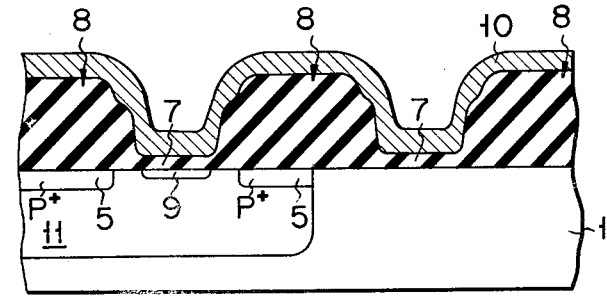

(IV) Then, following the conventional process, a gate electrode 10 consisting of polycrystalline silicon is formed on the gate oxide layer 7, and using the gate electrode 10 as a mask, arsenic is ion-implanted and activated to produce a n$^+$-type source and drain (not shown). After the formation of a CVD-SiO$_2$ layer and Al wiring, thermal treatment is effected for 60 minutes at 1,000° C. to produce CMOS IC (FIG. 12).

EXAMPLE 3

An application of this invention to produce n channel MOS IC will be explained using FIGS. 13 through 18.

Figure 13:
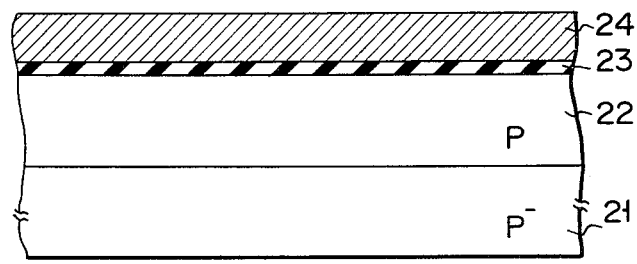
Figure 14:
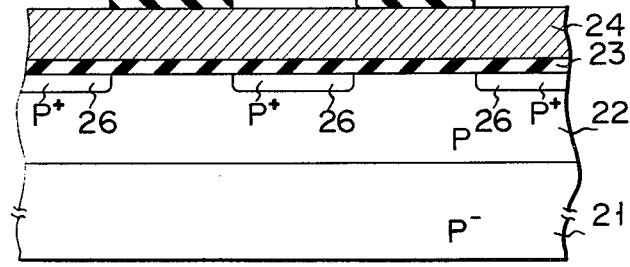

(I) First, a p-type monocrystalline silicon layer 22 of 10 Ωcm in specific resistance and 15 μm thick is grown by means of vapor growth on the surface of a p$^-$-type monocrystalline silicon substrate 21 of 0.005 Ωcm in specific resistance. After thermally treating this silicon layer to form a 1,000 Å thermally oxidized layer 23 on its main surface, a polycrystalline silicon layer is vapor-grown in POCl$_3$ atmosphere on the thermally oxidized layer 23 to deposit a 4,000 Å phosphorus-doped polycrystalline silicon layer 24 as an oxidizable material layer (FIG. 13). Next, a 2,000 Å silicon nitride layer is deposited by means of vapor growth directly upon the polycrystalline silicon layer 24 and a plurality of silicon nitride patterns 25 of 2 μm wide (W) and 2 μm pattern pitch (P), for instance, are formed by means of patterning through photo etching process using reactive spatter ion etching. Then, using the silicon nitride pattern 25 as a mask, boron is ion-implanted under the conditions of 180 KeV and $4\times10^{13}$/cm$^2$ dose and then activated to form a p$^+$-type channel stopper 26 on the p-type monocrystalline silicon layer 22 (FIG. 14). In this process, boron may be ion-implanted by using as a mask the photo resist pattern used in the formation of the silicon nitride pattern.

Figure 15:
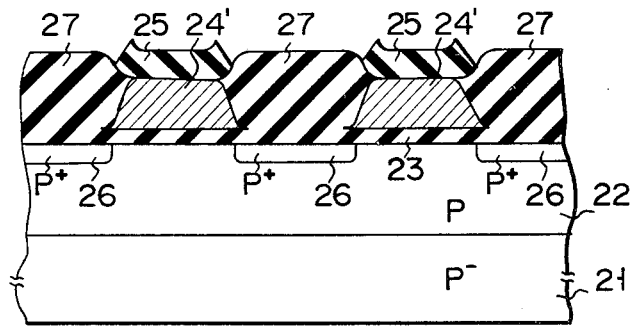

(II) Next, using the silicon nitride pattern 25 as a oxidation-proof mask, the polycrystalline silicon layer 24 is selectively oxidized. In the process, the exposed portions of the polycrystalline silicon layer 24 is oxidized to form a 8,000 Å oxide layer 27 for element isolation (FIG. 15). No oxynitride layer is recognized to be formed on the surface of the remaining polycrystalline silicon layer 24' along the thick oxide layer 27 below the silicon nitride pattern 25. In the selective oxidation, moreover, the thermally oxidized layer 23 has prevented the phosphorus in the polycrystalline silicon layer 24 from diffusing into the p-type monocrystalline silicon layer 22.

Figure 16:
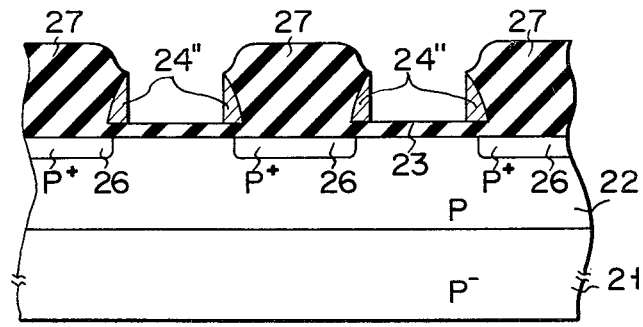

(III) Then, after removing the silicon nitride pattern 25 by means of CF$_4$ dry etching, the remaining polycrystalline silicon layer 24' is removed by means of CCl$_4$ reactive spatter ion etching. In the process, as no oxynitride layer exists on the surface of the remaining polycrystalline silicon layer 24', the said polycrystalline silicon layer 24' is perpendicularly etched with self-alignment against the thick oxide layer 26 and a polycrystalline silicon layer 24" is left beneath the overhung of the thick oxide layer 27 as shown in FIG. 16. Next, the thermally oxidized exposed layer 23 is removed by ammonium fluoride solution to expose part of the polycrystalline silicon layer 22 and thermal oxidation treatment is carried out. In the process, a 400 Å gate oxide layer 28 is grown on the exposed surface of the polycrystalline silicon layer 22 and at the same time the polycrystalline silicon layer 24" remaining beneath the overhung is oxidized to become an oxide layer to form, together with the thick oxide layer 27, an element isolation layer 29 without an overhung like the aforementioned thick oxide layer (FIG. 17). Using the element isolation layer 29 as a mask, boron is ion-implanted into the channel part of the p-type monocrystalline silicon layer below the gate oxide layer 27 under the conditions of 40 KeV output and $3\times10^{11}$/cm$^2$ to produce a p$^+$-type impurities region 30 for the control of threshold value (FIG. 17).

(IV) Then, following the convention process, a gate electrode 31 consisting of polycrystalline silicon is formed on the gate oxide layer 28, and using the gate electrode 31 as a mask arsenic is ion-implanted and then activated to produce a n$^+$-type source and drain (not shown). After the formation of a CVD-SiO$_2$ layer and Al wiring, thermal treatment is carried out for 60 minutes at 1,000° C. to produce n channel MOS IC with about 0.8 V in threshold value (FIG. 18).

In this invention, as an element isolation layer is formed by means of selective oxidation of the phosphorus-doped polycrystalline silicon layer 24 disposed on the monocrystalline silicon layer 22 which is superposed on the monocrystalline silicon layer 21, thermal effects upon the monocrystalline silicon layer 22 can be suppressed and thermal effects to cause defects in the monocrystalline silicon layer 22 and diffusion of impurities into the layer 22 could be reduced. Also, as the element isolation layer is produced by means of selective oxidation of the phosphorus-doped polycrystalline silicon layer 24 on the said silicon layer 22 instead of forming it by means of direct oxidation of the monocrystalline silicon layer 22 as in the conventional selective oxidation method, stress upon the monocrystalline silicon layer 22 can be avoided and thus problems of slipping dislocation and defects due to stress could be avoided.

EXAMPLE 4

Except for the use of a monocrystalline sapphire substrate instead of the p-type monocrystalline silicon substrate 21, the exactly same process as Example 3 is employed to produce n channel MOS IC. FIGS. 14 through 18 may be referred to explain Example 4, assuming that a sapphire substrate is used instead of the p-type monocrystalline silicon substrate. As a phosphorus-doped polycrystalline silicon layer disposed on the sapphire substrate 21 is selectively oxidized, an element isolation layer 29 of sufficient thickness (8,000 Å) can be formed in a considerably shorter time in comparison with selective oxidation of the monocrystalline silicon layer 22. As a result, thermal effects upon the sapphire substrate 21 and the monocrystalline silicon layer 22 can be suppressed. It is also possible to reduce stress due to difference in thermal expansion coefficient and in lattice distance between the sapphire substrate 21 and the silicon layer 22 and at the same time to reduce the diffusion of impurities into the silicon layer 22.

This invention can be applied not only to the production of n channel MOS IC and CMOS IC as discussed above but also to the production of p channel MOS IC, bipolar IC, I²L and CCD.

As discussed above, it is possible with this invention to produce an element isolation layer, without giving rise to various defects on a semiconductor substrate, by means of selective oxidation of an oxidizable material layer disposed on a semiconductor substrate. It is also possible to control the formation of bird's beak below an oxidation-proof mask during selective oxidation and to produce a finer element isolation layer as no oxynitride layer which behaves as an etching mask is present in the step of removing the oxidizable material layers remaining after the selective oxidation. This invention, therefore, offers a method to produce semiconductor devices having excellent electrical characteristics and which is suitable for making finer semiconductor elements.

What we claim is:

1. A method of manufacturing semiconductor device which comprises steps of:
   (a) creating an oxidizable material layer on a semiconductor substrate;
   (b) selectively forming an oxidation-proof mask directly on said oxidizable material layer and then selectively oxidizing the said oxidizable material layer using said mask thereby creating a thick oxide layer;
   (c) performing a perpendicular etching on an exposed oxidizable material layer on the substrate after removing said oxidation-proof mask to leave part of the said oxidizable material layer on the perpendicularly etched surface; and
   (d) oxidizing the oxidizable material layer remaining along the perpendicularly etched surface.

2. The method according to claim 1, wherein the semiconductor substrate employed in the step (a) comprises a semiconductor layer and a monocrystalline semiconductor layer epitaxially grown on the former semiconductor layer, and the oxidizable material layer is formed on the monocrystalline semiconductor layer.

3. The method according to claim 1, wherein the semiconductor substrate employed in the step (a) comprises a monocrystalline insulation substrate and a monocrystalline semiconductor layer superposed on said insulation substrate and the oxidizable material layer is formed on the monocrystalline semiconductor layer.

4. The method according to claim 3, wherein said insulation substrate is a sapphire substrate.

5. The method according to claim 1, wherein said oxidizable material layer is selected from the group consisting of polycrystalline silicon of high impurity concentration, molybdenum silicide and tungsten silicide.

6. The method according to claim 1, wherein an oxide layer is formed on the said semiconductor substrate prior to the formation of an oxidizable material layer in the step (a).

7. The method according to claim 1, wherein the thickness of the oxide layer is adjusted by taking into consideration the temperature and duration of selective oxidation in the step (b).

8. The method according to claim 6, wherein the thickness of the oxidation-proof layer in Process (b) is three times as thick as that of the oxide layer.

9. The method according to claim 1, wherein impurities are doped into the substrate by utilizing the oxidation-proof mask as a mask after the formation of said oxidation-proof mask in Process (b), to form a channel stopper layer on said substrate and then selective oxidization of the oxidizable material layer is carried out.

10. The method according to claim 9, wherein the doping of impurities is performed after the formation of an impurity-doping mask on the upper side of the oxidation-proof mask selectively formed.

11. The method according to claim 10, wherein the impurity-doping mask in claim 10 is a silicon dioxide, which is removed prior to the selective oxidation of an oxidizable material layer.

12. The method according to any one of the claims 1 to 11, wherein the oxidation-proof mask is made of silicon nitride.

13. The method according to claim 9, wherein the doping of impurities is carried out with the oxidation-proof mask covered with a photo resist which has been employed to form the said mask.

14. The method according to any one of claims 1 to 11, wherein the step (c) is carried out by means of anisotropic etching.

15. The method according to claim 14, wherein the anisotropic etching is a reactive spatter ion etching.

16. The method according to claim 14, wherein the anisotropic etching is an ion beam etching.

17. The method according to claim 1, wherein the step (c) is performed until part of the surface of the substrate is exposed.

18. The method according to claim 1, wherein said oxidizable material layer contain substantially no impurity.

* * * * *